United States Patent [19]

Shimada

[11] Patent Number: 5,126,566
[45] Date of Patent: Jun. 30, 1992

[54] DIMENSION MEASUREMENT SYSTEM UTILIZING SCANNING ELECTRON BEAM

[75] Inventor: Hiroshi Shimada, Tokyo, Japan
[73] Assignee: Jeol Ltd., Tokyo, Japan
[21] Appl. No.: 681,188
[22] Filed: Apr. 5, 1991
[30] Foreign Application Priority Data Apr. 6, 1990 [JP] Japan .................... 2-91494

[51] Int. Cl.$^5$ .................. G01N 23/00; H01J 37/28
[52] U.S. Cl. .................... 250/310; 250/307; 250/397
[58] Field of Search ............... 250/306, 307, 310, 311, 250/397

[56] References Cited

U.S. PATENT DOCUMENTS

| | | | |
|---|---|---|---|
| 4,286,154 | 8/1981 | Okubo et al. | 250/307 |
| 4,567,364 | 1/1986 | Kano et al. | 250/307 |
| 4,600,839 | 7/1986 | Ichihashi | 250/310 |
| 4,767,926 | 8/1988 | Murakoshi et al. | 250/310 |

Primary Examiner—Jack I. Berman
Assistant Examiner—James Beyer
Attorney, Agent, or Firm—Webb, Burden, Ziesenheim & Webb

[57] ABSTRACT

There is disclosed an electron beam metrological system which is inexpensive to fabricate but capable of accurately measuring the length of a circuit pattern formed on a wafer. The system comprises an X scan coil, a Y scan coil, an X scanning signal generator, a Y scanning generator, a detector for detecting secondary electrons emanating from a specimen when a rectangular region on the specimen is scanned by an electron beam in X and Y directions, a memory for storing the output signal from the detector, and a display unit for displaying an image of the rectangular region according to the data stored in the memory. The scanning generators are controlled by a CPU such that the scan made in the X direction is repeated plural times while the starting position of each scan is shifted in the X direction. The amount of the shift is so set that the beam hits the rectangular region at equally spaced positions. The signals stored in the memory in response to the repeated scan are used to determine the length.

4 Claims, 3 Drawing Sheets

DIMENSION MEASUREMENT SYSTEM UTILIZING SCANNING ELECTRON BEAM

FIELD OF THE INVENTION

The present invention relates to an electron beam metrological system for measuring the length of a circuit pattern or the like formed on a wafer.

BACKGROUND OF THE INVENTION

Extensive use of electron beam metrological systems is made to measure the lengths of circuit patterns formed on wafers and inspect them. One example of such electron beam metrological systems is disclosed in U.S. Pat. No. 4,767,926. This known system starts the measurement of the length of a specimen such as a wafer by digitally scanning the specimen with an electron beam. Secondary electrons are produced from the specimen and detected by a detector. The output signal from the detector is sent to a memory, where the signal is stored. Data is read from the memory to determine the length. As an example, when the width of a pattern of lines is to be measured, the signal read from the memory is processed to determine the addresses corresponding to the left edge and the right edge, respectively, of the pattern. In particular, the addresses at which the locally maximum values of the signal are stored are found to determine the addresses corresponding to both edges. Then, the difference between these two addresses is calculated. The length is determined, using this difference and the magnification of the image or other factor.

As semiconductor chips are manufactured at higher density, electron beam metrological systems have been required to measure lengths at higher resolution. One of the factors which determine the resolution of the metrology is the number of steps in the stepwise scan made in the X direction. Of course, the diameter of the electron beam also affects the resolution, but where the diameter is sufficiently small, if the number of the steps of the scan made in the X direction is doubled, then the resolution is improved by a factor of 2.

However, increasing the number of steps of the scan presents problems. As an example, if the number is increased from 512 to 1024, then an expensive monitor display with 1024×1024 pixels is needed. Also, an expensive frame memory and an expensive scanning system for the electron beam directed to the specimen are necessitated. Therefore, the conventional electron beam metrological system for high-resolution metrology is expensive to fabricate.

SUMMARY OF THE INVENTION

It is an object of the invention to provide a high-resolution electron beam metrological system which can be manufactured economically.

The above object is achieved by an electron beam metrological system comprising: a scanning means for causing an electron beam to scan a rectangular region on a specimen in X and Y directions; a detecting means for detecting electrons emanating from the specimen; a storage means for storing the output signal from the detecting means; a display means for displaying an image of the rectangular region according to the data stored in the storage means; a control means which controls the scanning means in such a way that a scan made in the X direction is repeated at the same Y position while shifting the starting position of each X scan; a setting means for setting the amount by which the starting position is shifted each time the X scan is repeated, in order that the electron beam hit the rectangular region at equally spaced positions; and a metrological means for determining a length according to the signals stored in the storage means in response to the scans made in the X direction.

Other objects and features of the invention will appear in the course of the description thereof which follows.

DETAILED DESCRIPTION OF THE INVENTION

Figure 1:
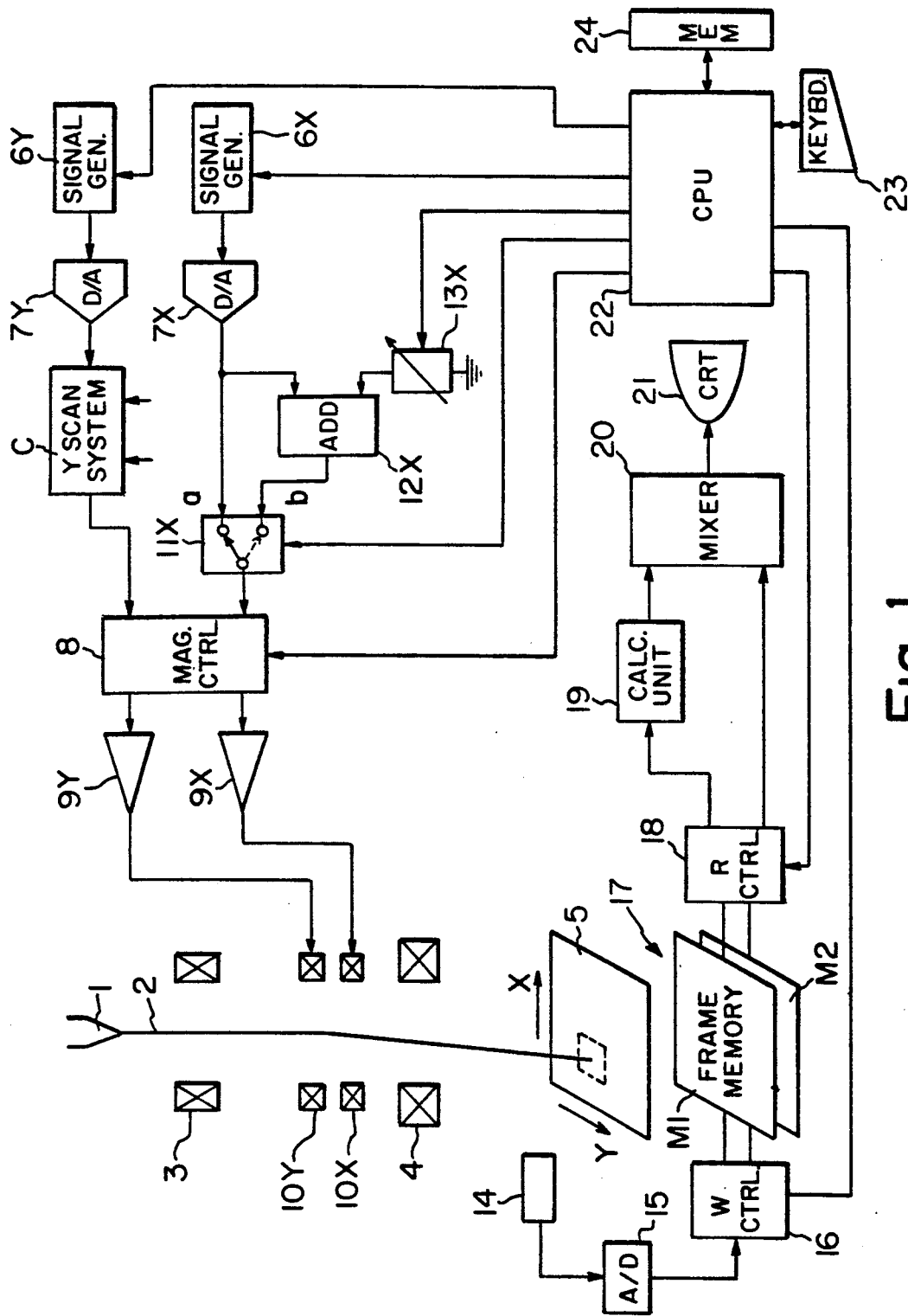
FIG. 1 is a block diagram of an electron beam metrological system according to the invention.

Referring to FIG. 1, there is shown an electron beam metrological system according to the invention. This system includes an electron gun 1 emitting an electron beam 2 which is focused onto a specimen 5 such as a wafer by a condenser lens 3 and an objective lens 4.

In order to cause the beam 2 to scan the specimen 5, an X scanning signal generator 6X and a Y scanning signal generator 6Y are provided. Digital scanning signals produced by the generators 6X and 6Y are converted into analog form by D/A converters 7X and 7Y, respectively. An X scanning signal produced by the D/A converter 7X is fed to one terminal "a" of a switching circuit 11X and also to an adder 12X. The adder 12X produces the sum of the signal from a DC signal generator 13X and the aforementioned X scanning signal. It is assumed that whenever the digital scanning signal from the X scanning signal generator 6X increments, the output signal from the D/A converter 7X increases by ΔV. At this time, the output signal from the DC signal generator 13X has a value of ΔV/2. The output signal from the adder 12X is sent to the other terminal "b" of the switching circuit 11X. The output signal from the adder 12X is furnished to an X scan coil 10X via a magnification control circuit 8 and via an amplifier 9X.

The present system also includes a Y scanning system C consisting of a switching circuit 11Y, an adder 12Y, and a DC signal generator 13Y (none of which are shown) which are similar to the switching circuit 11X, the adder 12X, and the DC signal generator 13X, respectively. The output signal from the D/A converter 7Y is supplied to the magnification control circuit 8 via the Y scanning system C. The output signal from the control circuit 8 is supplied to a Y scan coil 10Y via an amplifier 9Y.

As a specimen 5 is irradiated with the electron beam 2, secondary electrons are produced from the specimen 5. These electrons are detected by a detector 14. The output signal from the detector 14 is sent to a frame memory 17 via an A/D converter 15 and a writing control circuit 16. The frame memory 17 consists of memories M1 and M2. The image signal from the frame memory 17 is supplied to a length-calculating unit 19 via a reading control circuit 18. The calculating unit 19 processes the signal read from the memory 17 to calculate the spacing between both ends and to produce a character signal for displaying the calculated value. The character signal from the calculating unit 19 is fed to a mixer 20, which also receives the image signal from the frame memory 17 via the reading control circuit 18. A CRT 21 displays the calculated value together with an image of the specimen according to the output signal from the mixer 20.

These various circuits are controlled by a CPU 2. This CPU 22 produces a switching control signal to the switching circuits 11X and 11Y. The CPU also produces control signals to the writing control circuit 16 and the reading control circuit 18 so that data may be written to and read from the frame memory 17 under the control of these control circuits 16 and 18. Furthermore, the CPU 22 produces a magnification control signal to the magnification control circuit 8. A console 23 is connected with the CPU 22 to permit the operator to key in various instructions. A memory 24 storing a control program is also connected with the CPU 22.

Figure 2:
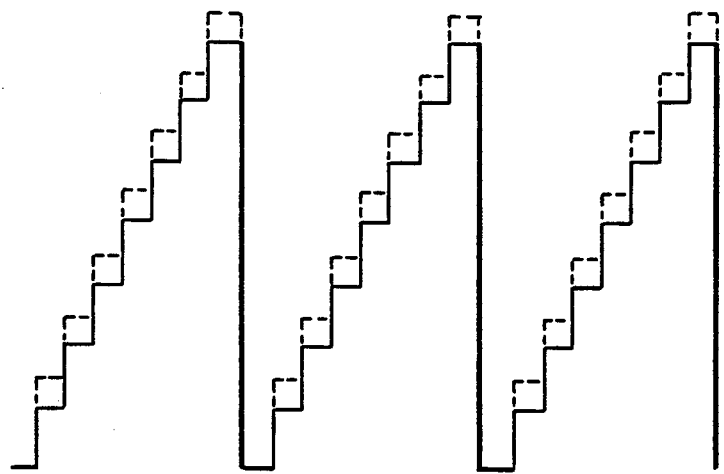
FIG. 2 is a waveform diagram illustrating signals produced by the system shown in FIG. 1 when scans are made in the X direction.
Figure 3:
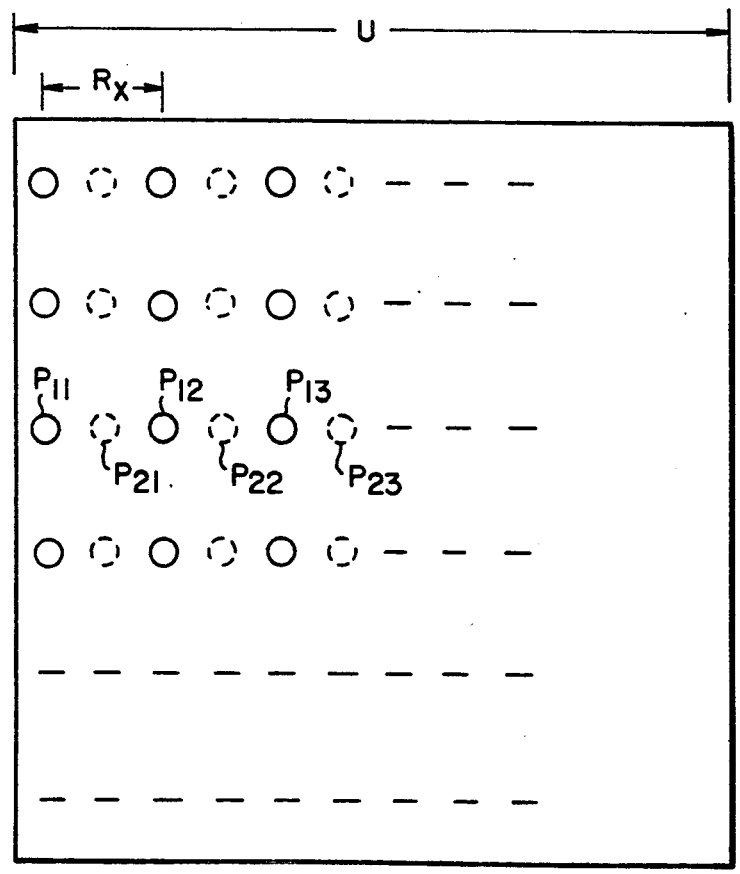
FIG. 3 is a diagram illustrating a scanned rectangular region on a specimen and the points at which an electron beam hits the region.

In the operation of the system constructed as described above, when the operator operates the console 23 to give instructions for starting the measurement of a length, the CPU 22 orders the X and Y scanning signal generators 6X and 6Y, respectively, to produce scanning signals. At the same time, the CPU 22 sends a control signal to the switching circuit 11X to connect its terminal "a" with the magnification control circuit 8. Then, the X scanning signal is converted into analog form by the D/A converter 7X and supplied to the switching circuit 11X. The X scanning signal (indicated by the solid line in FIG. 2) from the switching circuit X is fed to the X scanning coil 10X via the magnification control circuit 8. Meanwhile, the Y scanning signal is sent to the Y deflection coil 10Y via the magnification control circuit 8 and via the Y scanning system C. As a result, the electron beam hits the specimen at points indicated by the circles 0 drawn by the solid lines in FIG. 3. As the specimen is scanned with the beam in this way, a signal is derived from the detector 15 and sent to the frame memory 17, where the signal is stored in the memory M1 under the control of the writing control circuit 16. When the scan of one field is finished, the CPU 22 sends a control signal to the switching circuit 11X so that a signal may be supplied to the magnification control circuit 8 from the terminal "b". At this time, the CPU 22 gives no instruction to the switching circuit 11Y. Therefore, when the second scan in the Y direction is initiated, the output signal from the adder 12X is routed to the magnification control circuit 8 via the switching circuit 11X. As a result, the X scanning signal indicated by the broken line in FIG. 2 is sent to the magnification control circuit 8. A scan is made in the X direction according to this X scanning signal. In the second scan in the Y direction, the electron beam is made to hit the successive positions indicated by the circles O drawn by the broken lines in FIG. 3. During this scan, the output signal from the detector 14 is stored in the memory M2. If the console 23 is operated to give instructions for starting the measurement of a length, then image signals stored in the memories M1 and M2 are sent to the length-calculating unit 19.

Where the width of the pattern of lines is measured, the calculating unit 19 operates in the manner described now. Referring to FIG. 3, it is assumed that the electron beam hits the specimen at points $P_{11}$, $P_{12}$, $P_{13}$, and so on during the first X scan and that the beam hits the specimen at points $P_{21}$, $P_{22}$, $P_{23}$, and so on during the second X scan. The signals produced from these points may be referenced by $S(P_{ij})$. Signals are read from the memories M1 and M2 alternately such that $S(P_{11})$, $S(P_{21})$, $S(P_{12})$, $S(P_{22})$, $S(P_{13})$, $S(P_{23})$, and so on are read out in this order. These signals read out successively are compared by the length-calculating unit 19 to find signals indicating locally maximum values corresponding to the left edge and the right edge, respectively of the pattern. Then, the difference between the addresses corresponding to both edges is calculated. If $S(P_{21})$ and $S(P_{13})$ indicate locally maximum values corresponding to the left edge and the right edge, respectively, the difference between the addresses is 3, for example. The calculating unit 19 computes a value indicating the width of the pattern from the difference between the addresses. An image signal is read from the memory M1 under the control of the CPU 22 and sent to the mixer 20. The result is that characters indicating the measured value are displayed together with an image of the specimen on the CRT 21.

As can be seen from the description made thus far, the novel electron beam metrological system is able to measure lengths at improved resolution without the need to use high-resolution components in the scanning systems, in the monitor for observing a specimen image, or in the memories storing image signals. Hence, the metrological system can be manufactured economically.

It is assumed that the X scan is made at intervals of $R_x$. In the above example, the position at which the X scan is started is shifted by $R_x/2$ when the second Y scan begins. Another example is also possible as illustrated in FIG. 4.

Figure 4:
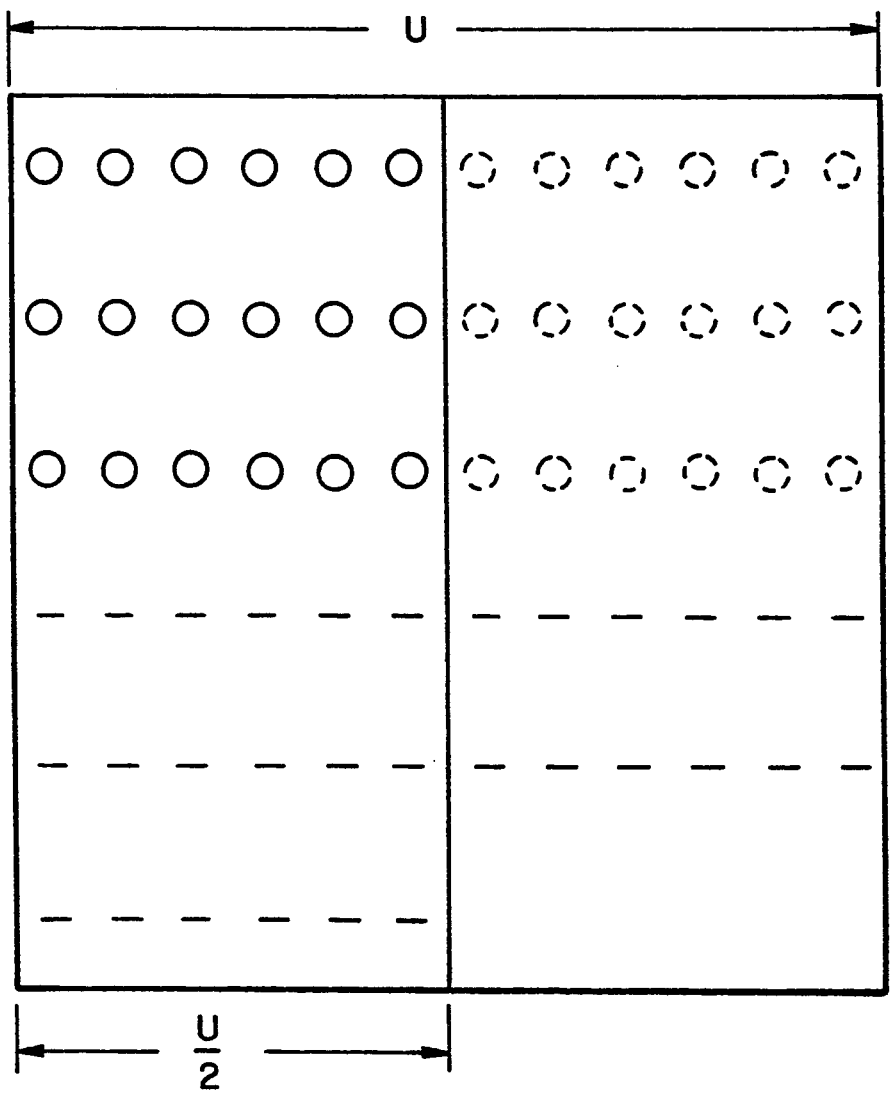
FIG. 4 is a diagram similar to FIG. 3, but illustrating the operation of another electron beam metrological system according to the invention.

Referring also to FIG. 4, the magnification control signal is sent from the CPU 22 to the magnification control circuit 8. Only the magnification) in the X direction is compared with the example described in connection with FIG. 1. In the above example, it is assumed that the rectangular region has a dimension of U in the X direction. The DC signal generator 13X is so set up that it produces a signal necessary to shift the position at which the X scan is started by U/2.

In this structure, during the first field scan, the electron beam hits the specimen at positions indicated by the circles 0 drawn by the solid lines in FIG. 4. The left half of the rectangular region is scanned. The output signal from the detector is stored in the memory M1. During the second field scan, the output signal from the adder 12X is supplied to the resolution switching circuit 8 via the switching circuit 11X under the control of the CPU 22. As a result, during the second field scan, the X scan is commenced from the position shifted by U/2 from the first starting position of the X scan. The right half of the region shown in FIG. 4 is scanned by this second field scan. The output signal from the detector is stored in the memory M2. Also in this example, the X scan is made across the specimen in steps twice as close as the steps of the X scan made in the prior art techniques. Consequently, this example yields the same advantages as the example described first. In this example, it is necessary to send both every second signals of the image signals from the memory M1 and every second signals of the image signals from the memory M2 to the CRT which provides a display of an image.

In the above examples, each irradiated point such as $P_{11}$, $P_{12}$, or $P_{13}$ is illuminated with the electron beam once. It is also possible that these points are illuminated twice or more by making plural scans. In this case, the signals obtained by making plural X scans are summed up to improve the signal-to-noise ratio.

In the above examples, the starting position of the X scan is shifted simultaneously with the start of the second Y scan. Two X scans may be successively made from different starting positions. Also, in the above examples, the specimen is illuminated with the electron beam at intervals twice as close as the prior art illuminating interval in the X direction. Instead of narrowing the illuminating interval in the X direction, the interval may be narrowed in the Y direction. Especially, where the dimension of the pattern along the Y direction is measured, it is effective to shift the starting position of the Y scan instead of the starting position of the X scan, under the control of the CPU 22.

Moreover, the specimen may be illuminated with the electron beam at closer intervals both in X and Y directions. In the above examples, the rectangular region is illuminated with the electron beam at intervals twice as close as the conventional illuminating interval in the X direction. The illuminating interval may be narrowed by a factor of A (where A is an integer equal to or more than 2) by repeating the X scan A times while changing the starting position of the X scan by $R_x/A$ every time.

A second deflector for shifting the starting position of the X scan may be provided independent of the scanning deflector. A signal is supplied to this second deflector to shift the starting position of the X scan.

Additionally, when signals are written to the frame memory, the writing control circuit may be controlled in such a way that the signals $S(P_{11})$, $S(P_{21})$, $S(P_{12})$, $S(P_{22})$, $S(P_{13})$, $S(P_{23})$, and so on are stored at successive addresses corresponding to this sequence.

In the examples described already in conjunction with FIGS. 3 and 4, two signals obtained by two X scans having the same Y position are paired up in order to determine the length. However, two signals obtained during two X scans having different Y position can be paired up in order to determine the length, if the difference of Y position is slight.

Having thus described the invention with the detail and particularity required by the Patent Laws, what is claimed and desired to be protected by Letters Patent is set forth in the following claims.

What is claimed is:

1. A dimension measurement system utilizing a scanning electron beam comprising:
   a scanning means for causing an electron beam to stepwise scan a rectangular region on a specimen in X and Y directions;
   a detecting means for detecting electrons emanating from the specimen;
   a storage means for storing the output signal from the detecting means;
   a display means for displaying an image of the rectangular region according to the data stored in the storage means;
   a control means which controls the scanning means in such a way that a stepwise scan made in the X direction for a given Y position is repeated while shifting the starting position of each X scan;
   a setting means for setting the amount by which the starting position is shifted each time the X scan is repeated for a given Y position, in order that the electron beam hit the rectangular region at equally spaced positions;
   a composing means for correlating the multiple signals obtained in response to the multiple X scans having different X starting positions in order to obtain a single signal corresponding to the line covered by the said multiple X scans; and
   a dimension measurement means for determining a length in X direction according to the signal obtained by the composing means.

2. The dimension measurement system of claim 1, wherein said amount set by said setting means is U/A, where U is the dimension of the rectangular region along the X direction, and A is the number of repetition of the X scan.

3. An electron beam dimension measurement system utilizing a scanning electron beam comprising:
   a scanning means for causing an electron beam to stepwise scan a rectangular region on a specimen in X and Y directions;
   a detecting means for detecting electrons emanating from the specimen;
   a storage means for storing the output signal from the detecting means;
   a display means for displaying an image of the rectangular region according to the data stored in the storage means;
   a control means which controls the scanning means in such a way that a stepwise scan made in the X direction for a given Y position is repeated while shifting the starting position of each X scan;
   a setting means for setting the amount by which the starting position is shifted each time the X scan is repeated for a given Y position, in order that the electron beam hit the rectangular region at equally spaced positions wherein said amount set by said setting means is $R_x/A$, where $R_x$ is the interval at which the stepwise scan is made in the X direction, and A is the number of repetition of the X scan; and
   a metrological means for determining a length according to the signals stored in the storage means in response to the scans made in the X direction.

4. An electron beam dimension measurement system utilizing a scanning electron beam comprising:
   a scanning means for causing an electron beam to stepwise scan a rectangular region on a specimen in X and Y directions;
   a detecting means for detecting electrons emanating from the specimen;
   a storage means for storing the output signal from the detecting means;
   a display means for storing the output signal from the detecting means;
   a display means for displaying an image of the rectangular region according to the data stored in the storage means;
   means for reading those signals from said storage means which are obtained during the X scans having the same starting X position and wherein an image of the specimen is displayed on said display means according to the signals read from the storage means in this way;
   a control means which controls the scanning means in such a way that a stepwise scan made in the X direction for a given Y position is repeated while shifting the starting position of each X scan;
   a setting means for setting the amount by which the starting position is shifted each time the X scan is repeated for a given Y position, in order that the electron beam hit the rectangular region at equally spaced positions wherein said amount set by said setting means is $R_x/A$, where $R_x$ is the interval at which the stepwise scan is made in the X direction, and A is the number of repetition of the X scan; and a metrological means for determining a length according to the signals stored in the storage means in response to the scans made in the X direction.

* * * * *

UNITED STATES PATENT AND TRADEMARK OFFICE
CERTIFICATE OF CORRECTION

PATENT NO. : 5,126,566
DATED : June 30, 1992
INVENTOR(S) : Hiroshi Shimada

It is certified that error appears in the above-identified patent and that said Letters Patent is hereby corrected as shown below:

Cover page, item [73] Assignee: "Jeol" should read --JEOL--.

Column 3 Line 13 "2" should read --22--. (first occurrence)

Column 3 Line 36 "X" should read --11X--.

Column 3 Line 42 "0" should read --O--.

Column 4 Line 40 "magnification)" should read --magnification--.

Column 4 Line 49 "0" should read --O--.

Signed and Sealed this

Thirtieth Day of November, 1993

Attest:

BRUCE LEHMAN

Attesting Officer

Commissioner of Patents and Trademarks